United States Patent [19]
Ohannes et al.

[11] Patent Number: 5,233,237
[45] Date of Patent: Aug. 3, 1993

[54] BICMOS OUTPUT BUFFER NOISE REDUCTION CIRCUIT

[75] Inventors: James R. Ohannes, Portland; Stephen W. Clukey, South Portland; E. David Haacke, Westbrook; Roy L. Yarbrough, Hiram, all of Me.

[73] Assignee: National Semiconductor Corporation, Santa Clara, Calif.

[21] Appl. No.: 803,466

[22] Filed: Dec. 6, 1991

[51] Int. Cl.$^5$ .................. H03K 19/003; H03K 19/02
[52] U.S. Cl. ..................................... 307/443; 307/446
[58] Field of Search ............... 307/443, 446, 448, 475, 307/570

[56] References Cited

U.S. PATENT DOCUMENTS

| | | | |
|---|---|---|---|
| 4,845,386 | 7/1989 | Ueno | 307/443 |
| 4,902,914 | 2/1990 | Masuoka | 307/446 |
| 4,961,010 | 10/1990 | Davis | 307/443 |
| 4,972,104 | 11/1990 | Estrada | 307/475 |
| 5,036,222 | 7/1991 | Davis | 307/443 |
| 5,081,374 | 1/1992 | Davis | 307/451 |
| 5,101,123 | 3/1992 | Ten Eyck | 307/446 |

Primary Examiner—Edward P. Westin
Assistant Examiner—Benjamin D. Driscoll
Attorney, Agent, or Firm—Daniel H. Kane; James W. Rose; Richard C. Calderwood

[57] ABSTRACT

A BICMOS output buffer circuit delivers output signals of high and low potential levels at an output ($V_{OUT}$) in response to data signals at an input ($V_{IN}$). A CMOS output pulldown driver transistor (Q60) sources base drive current to a relatively large current conducting bipolar primary output pulldown transistor (Q44). A relatively small current conducting CMOS secondary output pulldown transistor (Q60A) is coupled with primary current path in parallel with the primary current path of the bipolar primary output pulldown transistor (Q44) between the output ($V_{OUT}$) and low potential power rail (GNDN). The control gate node of CMOS secondary output pulldown transistor (Q60A) is coupled to the control gate node of the CMOS output pulldown driver transistor (Q60) to initiate pulldown of a small sinking current before turn on of the bipolar primary output pulldown transistor (Q44) to reduce the maximum peak output noise ($V_{OLP}$). A feed forward circuit capacitance is coupled between the control gate node of the CMOS output pulldown driver transistor (Q60) and base node of the bipolar output pulldown transistor (Q44). The capacitance value is selected to pass a transient capacitive current sufficient for early turn on of the bipolar output pulldown transistor before the CMOS output pulldown driver transistor delivers sustained conduction current to reduce the maximum "valley" output noise ($V_{OLV}$).

18 Claims, 8 Drawing Sheets

BICMOS OUTPUT BUFFER NOISE REDUCTION CIRCUIT

CROSS REFERENCE TO RELATED PATENT APPLICATIONS

This invention is related to the James R. Ohannes, Stephen W. Clukey, E. David Haacke, Roy L. Yarbrough et al. U.S. patent application Ser. No. 804,105 filed concurrently for BICMOS OUTPUT BUFFER CIRCUIT WITH CMOS DATA PATHS & BIPOLAR CURRENT AMPLIFICATION, and to other U.S. patent applications there referenced. The present invention is an improvement on the basic BICMOS output buffer circuit described in the related U.S. patent application.

TECHNICAL FIELD

This invention is related to BICMOS output buffer circuits for delivering output signals of high and low potential levels at an output in response to data signals at an input. The output buffer circuits incorporate the low power requirements and high speed advantages of CMOS transistors such as NMOS and PMOS transistors and the low capacitance and high current amplification advantages of bipolar transistors such as NPN transistors. In particular the present invention is directed to BICMOS output buffer noise reduction circuits for reducing peak output noise $V_{OLP}$, $V_{OLV}$ at a high current drive bipolar output stage with CMOS predriver stages.

BACKGROUND ART: DESCRIPTION OF RELATED PATENT APPLICATION

A non-inverting BICMOS tristate output buffer circuit according to the related patent application noted above is illustrated in FIG. 1. The BICMOS output buffer circuit delivers output signals of high and low potential levels H,L at the output $V_{OUT}$ in response to data signals at the input $V_{IN}$. Darlington bipolar output pullup transistors Q24,Q22 source current to the output $V_{OUT}$ from the high potential output supply rail $V_{CCN}$ through diode SD1 and resistor R6 coupled to the collector node of bipolar output pullup transistor Q22. High current drive bipolar output pulldown transistor Q44 composed of parallel transistor elements Q44A and Q44B sinks current from the output $V_{OUT}$ to the low potential output ground rail GNDN.

On the pullup side of the output buffer circuit a CMOS pullup driver circuit is coupled to the output pullup transistors. The CMOS pullup driver circuit is composed of a first pullup predriver input inverter stage Q15,Q14 coupled to the input $V_{IN}$, and a second pullup driver inverter stage Q21A,Q20 coupled to the first inverter stage Q15,Q14 at an intermediate node n1. The second inverter stage Q21A,Q20 is coupled to the base nodes of bipolar output pullup transistors Q24,Q22. With a high potential level data signal H at the input $V_{IN}$, the second pullup driver inverter stage PMOS transistor Q21A provides base drive current to bipolar transistor Q24. Bipolar transistor Q24 in turn sources amplified base drive current from output supply rail $V_{CCN}$ to bipolar output pullup transistor Q22 through Schottky diode SD1 and resistor R5.

For a low potential level data signal L at the input $V_{IN}$, the second pullup driver inverter stage NMOS transistor Q20 discharges the base of bipolar output pullup transistors Q24,Q22. The discharge path from the base node of output pullup transistor Q22 contains breakdown protection voltage drop components in the form of Schottky diodes SD12 and SD11. Diodes SD11 and SD12 add sufficient voltage difference to prevent breakdown current flow back from the output $V_{OUT}$ through the base/emitter junction of output pullup transistor Q22. This breakdown protection prevents current flow through NMOS transistor Q20 during the high impedance third state at the output. In the tristate mode of operation of the BICMOS output buffer circuit hereafter described, a high potential level signal at the output $V_{OUT}$ from another output buffer circuit on a common bus might otherwise cause breakdown current to flow in a discharge path through Q22 and Q20.

On the pulldown side of the BICMOS output buffer circuit, a first pulldown predriver input inverter stage Q11,Q10 is coupled to the input $V_{IN}$. A second pulldown driver stage Q60,Q9A is coupled to the base node of the bipolar output pulldown transistor Q44. The pulldown driver stage includes an NMOS pulldown driver transistor Q60 having a control gate node coupled to a common node n2 of the pulldown predriver input stage Q11,Q10. The pulldown driver transistor Q60 is coupled for sourcing current from the high potential level power rail $V_{CCQ}$ through diode SD3 and limiting resistor R4 to the base node of bipolar output pulldown transistor Q44. Transistor Q60 is an effective "phase splitter" operating bipolar output pulldown transistor Q44 out of phase with bipolar output pullup transistor Q22.

The pulldown driver stage also includes a Miller Killer transistor Q9A coupled for sinking parasitic Miller capacitance current from the base node of bipolar pulldown transistor Q44 to the output ground GNDN. A Miller Killer predriver stage Q40,Q41 is coupled between the common node n2 of the pulldown predriver input stage Q11,Q10 and the control gate node of the MK transistor Q9A. The small current conducting MK transistor Q9A and MK predriver stage transistors Q40,Q41 are constructed with small channel width dimensions for fast switching operation. The operation of MK transistor Q9A is sufficiently fast so that it operates as an ACMK during HL transitions at the output $V_{OUT}$ as well as a DCMK transistor after switching during steady state high H at the output $V_{OUT}$.

An accelerating feedback diode SD4 is coupled between the output $V_{OUT}$ and the drain node of pulldown driver transistor Q60. Discharge current from the output $V_{OUT}$ is therefore fed back through the primary current path of NMOS pulldown driver transistor Q60 for accelerating turn on of the bipolar output pulldown transistor Q44 during transition from high to low potential level HL at the output.

The BICMOS output buffer circuit of FIG. 1 and FIG. 4 also incorporates a tristate enable circuit having complementary tristate enable signal inputs E and EB. A CMOS pullup tristate enable stage Q16,Q13 is coupled in a NAND gate coupling with the pullup predriver input stage Q15,Q14 in the first data signal path. Thus, the PMOS transistors Q16,Q15 are coupled in parallel and the NMOS transistors Q14,Q13 are coupled in series. The NAND gate inputs are the data input $V_{IN}$ and the enable signal input E.

A pulldown tristate enable stage Q12,Q9 is coupled in a NOR gate coupling with the input pulldown predriver stage Q11,Q10 in the second data signal path.

Thus, PMOS transistors Q12,Q11 are coupled in series and NMOS transistors Q10,Q9 are coupled in parallel. The NOR gate inputs are the data input $V_{IN}$ and the complementary enable signal input EB.

MOS, bipolar, and BICMOS integrated circuit output buffers and devices turn on the pulldown transistor element for discharging the output load capacitance and for sinking current from the output to external ground during transition from high to low potential at the output. The surge or acceleration of charge develops a voltage across the output ground lead inductance proportional to L di/dt resulting in a positive ground rise in potential or ground bounce in what should be a statically low output This output ground bounce may typically be in the order of 0.5 to 2.5 volts above the external ground 0 volts for circuits with a power source $V_{CC}$ operating at 5 volts. The maximum or "peak" ground bounce output noise which this causes at the output $V_{OUT}$ is referred to herein as $V_{OLP}$.

Deceleration of the initial surge of sinking current charge through the pulldown transistor element develops another voltage across the output ground lead inductance causing a negative ground voltage undershoot of potential in the output ground lead having opposite polarity from the ground bounce. The absolute value of the output undershoot negative spike may be greater than the positive ground bounce spike. The maximum "valley" or minimum peak of the ground undershoot output noise which this causes at the output $V_{OUT}$ is referred to herein as $V_{OLV}$.

The disruptive effects of this noise from the output ground and supply leads at the output $V_{OUT}$ include interference with other low or quiet outputs on a common bus. The present invention is particularly directed to reducing the problem of disruption of quiet outputs on a common bus. For example, an active low output $V_{OUT}$ of an octal buffer line driver on a common bus may experience a peak output noise voltage rise $V_{OLP}$ causing a false high signal. These problems associated with output ground and supply noise are of increased concern as integrated circuits switch higher currents at higher speeds.

Reduction of switching induced noise in an all-CMOS transistor output buffer circuit is described in the Jeffrey B. Davis U.S. Pat. No. 4,961,010. The Davis CMOS transistor output buffer circuit 40 is illustrated in FIG. 2. Multiple output buffers of this type may be incorporated, for example, as output buffers in an octal buffer line driver. The pulldown transistor element is provided by the relatively large current conducting NMOS transistor N3. The pullup transistor element is provided by relatively large current PMOS transistor element P3. Output buffer 40 is a non-inverting tristate output device, and data signals propagate from the input $V_{IN}$ to the output $V_{OUT}$. The tristate output enable and disable signals are applied at the OE terminal input.

A data signal at the input $V_{IN}$ passes through two inverting current amplification stages 12, 14 and then is applied at the same polarity as an input to NAND gate 15 and NOR gate 16. NAND gate 15 drives pullup transistor element P3. NOR gate 16 drives the pulldown transistor element N3. The second input to each of the gates 15, 16 is derived from the OEB terminal input.

The tristate enable signal OEB is applied in inverted polarity from output enable signal OE at the tristate OEB terminal. This tristate signal passes through first and second inverting current amplification stages 18, 20 and is applied at the same polarity as the OEB signal to an input of NOR gate 16. The tristate signal also passes through first and second inverting stages of current amplification 18, 20 and a third inverter stage 22 before it is applied to the input of NAND gate 15. The tristate signal applied to the input of NAND gate 15 is thus of opposite polarity from the OEB signal and is in phase with output enable signal OE.

The output buffer circuit 40 according to U.S. Pat. No. 4,961,010 includes a relatively small current conducting secondary pullup transistor element, PMOS transistor P1. A relatively small current secondary pulldown transistor element is provided by NMOS transistor N1. The ratio of current carrying capacities of the primary pulldown transistor element N3 to the secondary pulldown transistor element N1 is preferably at least 4 to 1 or greater and typically in the range of 4/1 to 7/1. The same ratio of current carrying capacities is used for the primary to secondary pullup transistor elements.

Referring to FIG. 2, a time constant delay between early turn on of the secondary pulldown transistor element N1 and the primary pulldown transistor element N3 is provided by a separate resistor or resistance element R1 coupled between the control terminal leads of the secondary and primary pulldown transistor elements N1 and N3. Resistor R1 cooperates with the inherent input gate oxide capacitance of pulldown transistor N3 to form an RC network with a time constant delay of for example 1 to 5 ns.

Similarly on the supply side, separate resistor element R2 is coupled between the control terminal leads or gates of secondary and primary pullup transistor elements P1 and P3. Resistor R2 is typically selected to have a value cooperating with the larger output capacitance of primary pullup element P3 to provide the desired RC time constant delay between the early turn on of secondary pullup transistor P1 and the later turn on of primary pullup transistor element P3.

A feature of this circuit described in U.S. Pat. No. 4,961,010 is that the early turn on of a small current carrying capacity secondary pulldown transistor element initiates pulldown at the output and sinking of current from the output at only a small current sinking level. The initial sinking current level and the charge acceleration are constrained by the size and internal resistance of the small current carrying capacity transistor element. As a result the positive ground rise of potential proportional to di/dt is also constrained to a lower level, typically less than one half that of a conventional output buffer.

The separate pulldown delay resistance element and the parasitic capacitance of the primary pulldown transistor element form an RC delay network which delays turn on of the primary or large current carrying capacity pulldown transistor element. This delay is determined by the selected resistance value of the pulldown delay resistance element and consequent time constant of the RC delay network. An advantage of this arrangement according to U.S. Pat. No. 4,961,010 is that the small secondary sinking current continues to discharge the charge stored in the output load capacitance during the time constant delay. Upon turn on of the primary large current carrying capacity pulldown transistor element a second positive ground rise of potential occurs. However, the second ground bounce is now also limited by the reduction in charge in the output load capacitance already effected by the early small secondary sinking current. The reduced sinking current level and charge level also constrains and limits subsequent ground undershoot.

The Jeffrey B. Davis U.S. Pat. No. 4,961,010 describes noise reduction circuits for either an all CMOS transistor IC output buffer circuit or an all bipolar transistor IC output buffer circuit. Similarly the related Jeffrey B. Davis U.S. Pat. No. 5,036,222 issued Jul. 30, 1991 for OUTPUT BUFFER CIRCUIT WITH OUTPUT VOLTAGE SENSING FOR REDUCING SWITCHING INDUCED NOISE and the related Jeffrey B. Davis U.S. patent application Ser. No. 483,927 filed Feb. 22, 1990 for OUTPUT BUFFER CIRCUIT WITH SIGNAL FEED FORWARD FOR REDUCING SWITCHING INDUCED NOISE describe other noise reduction circuits for all CMOS transistor output buffer circuits. It is not apparent from these references how noise reduction may be achieved in the integrated BICMOS output buffer circuits with mixed CMOS transistors and bipolar transistors, for example as described in the related patent application.

OBJECTS OF THE INVENTION

It is an object of the present invention to reduce output noise in BICMOS output buffer circuits which combine the low power requirements and high speed advantages of CMOS transistors for defining data signal paths with the relatively low switching capacitance and high current amplification advantages for current amplification of data signals at the output.

Another object of the invention is to reduce the maximum and minimum output noise peaks $V_{OLP}$, $V_{OLV}$ for protecting quiet outputs coupled to a common bus with the BICMOS output buffer circuit during switching of the BICMOS output buffer circuit.

A further object of the invention is to combine several interacting circuit elements for controlling and shaping edge rates of output signal transitions at the output for reducing output noise peaks.

DISCLOSURE OF THE INVENTION

In order to accomplish these results the invention provides a relatively small current capacity CMOS secondary output pulldown transistor having a primary current path through drain and source nodes coupled between the output and low potential power rail of the BICMOS output buffer circuit. The primary current path of the CMOS secondary output pulldown transistor is coupled in parallel with the primary current path through collector and emitter nodes of a bipolar primary output pulldown transistor. The control gate node of the CMOS secondary output pulldown transistor is coupled to the control gate node of a CMOS output pulldown driver transistor to initiate pulldown of a small sinking current from the output directly to ground. The early small sinking current is initiated before turn on of the bipolar primary output pulldown transistor by the CMOS output pulldown driver transistor to reduce the maximum peak $V_{OLP}$ of the output noise sensed at a quiet output.

The primary current path of the CMOS secondary output pulldown transistor is coupled to the output through a secondary output pulldown diode. In the preferred example the CMOS secondary output pulldown transistor is an NMOS transistor having a drain node coupled to the output through a Schottky diode.

As a further circuit element in the edge rate control, an accelerating feedback diode is coupled between the output and the primary current path of the CMOS output pulldown driver transistor to increase base drive current to the bipolar output pulldown transistor. A feature of the invention is that the CMOS secondary output pulldown transistor softens the sharpness of the edge rate caused by an accelerating feedback diode in high speed switching while at the same time discharging some of the output load capacitance before turn on of the bipolar primary output pulldown transistor. As a result the discharge of output load capacitance is better distributed over the time interval available for high speed switching, reducing the maximum peak $V_{OLP}$ of output noise without sacrificing propagation delay.

According to another embodiment of the invention, feed forward circuit capacitance is coupled between the control gate node of the CMOS output pulldown driver transistor and the base node of the bipolar output pulldown transistor. The feed forward circuit capacitance is selected with capacitance value great enough to pass a transient capacitive current to the base node of the bipolar output pulldown transistor upon occurrence of an input signal transition at the control gate node of the CMOS output pulldown driver transistor. The capacitive value causes transient capacitive current sufficient for early turn on of the bipolar output pulldown transistor before the CMOS output pulldown driver transistor delivers sustained conduction current to the base node of the bipolar output pulldown transistor. This transient capacitive current and early turn on reduces peak output noise and in particular the minimum peak or "valley" $V_{OLV}$ of the output noise for protection of other inputs on a common bus.

In the preferred example the feed forward circuit capacitance is provided by a relatively large control gate channel capacitance of the CMOS output pulldown driver transistor. The relatively large channel capacitance generates the transient capacitive current sufficient for early turn on of the bipolar output pulldown transistor at a reduced level. The output pulldown driver transistor subsequently turns on to deliver sustained conduction current to the bipolar output pulldown transistor but with noise peaks reduced.

According to an alternative embodiment, the circuit capacitance is provided by a separate circuit component capacitor coupled between the gate node of the CMOS pulldown driver transistor and the base node of the bipolar output pulldown transistor. A relatively high resistance drain resistor is coupled between the drain node of the CMOS pulldown driver transistor and high potential power rail for limiting base drive current to the bipolar output pulldown transistor.

According to another embodiment of the invention the relatively small current conducting CMOS secondary output pulldown transistor and the feed forward circuit capacitance are combined in the BICMOS output buffer for reduction of maximum and minimum peaks and valleys of output noise.

Other objects, features and advantages of the invention are set forth in the following specification and accompanying drawings.

DESCRIPTION OF PREFERRED EXAMPLE EMBODIMENTS AND BEST MODE OF THE INVENTION

Figure 1:
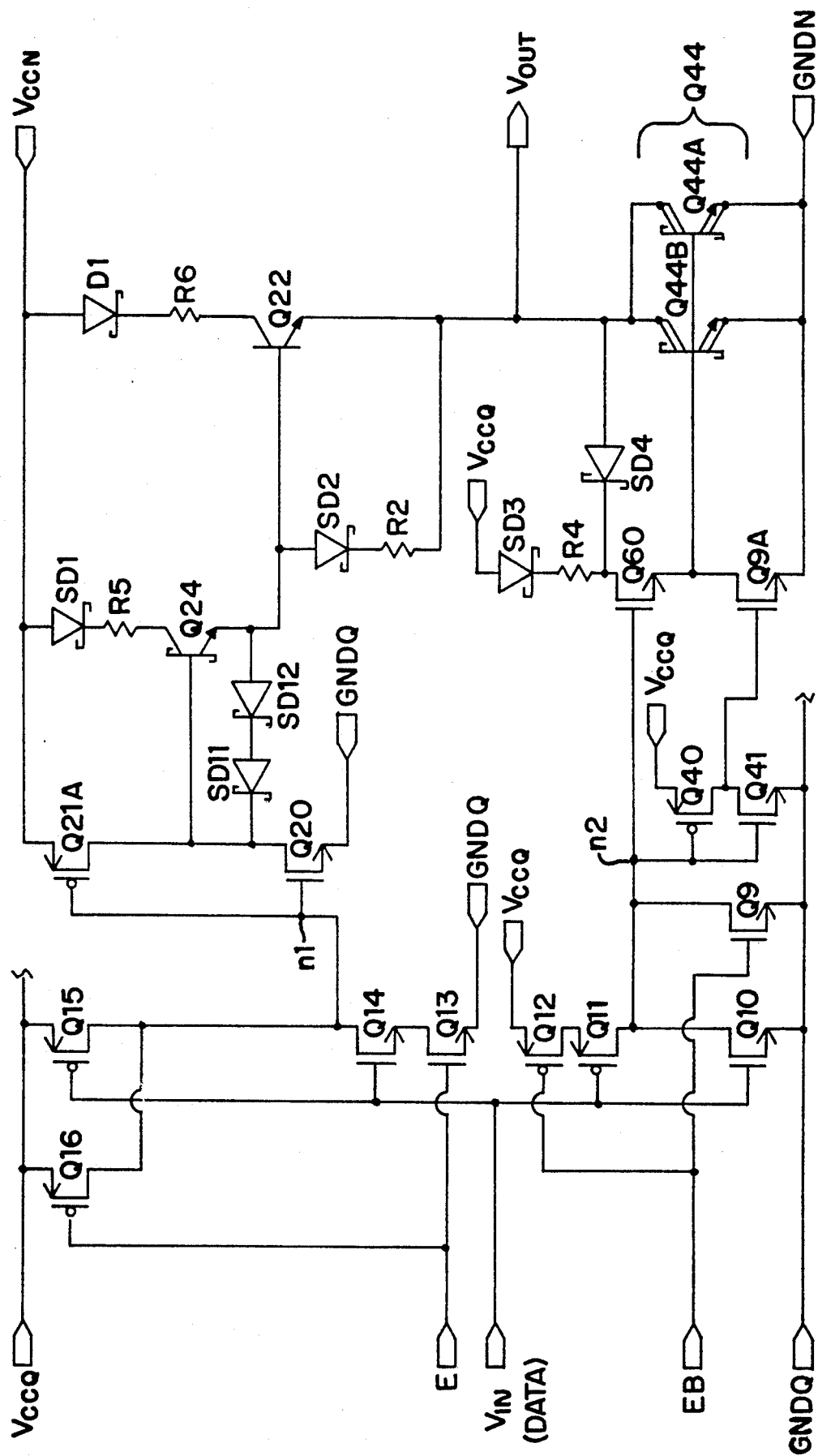
FIG. 1 is a schematic circuit diagram of the BICMOS output buffer circuit in the related James R. Ohannes et al. U.S. patent application Ser. No. 804,105 filed concurrently for BICMOS OUTPUT BUFFER CIRCUIT WITH CMOS DATA PATHS AND BIPOLAR CURRENT AMPLIFICATION.
Figure 2:
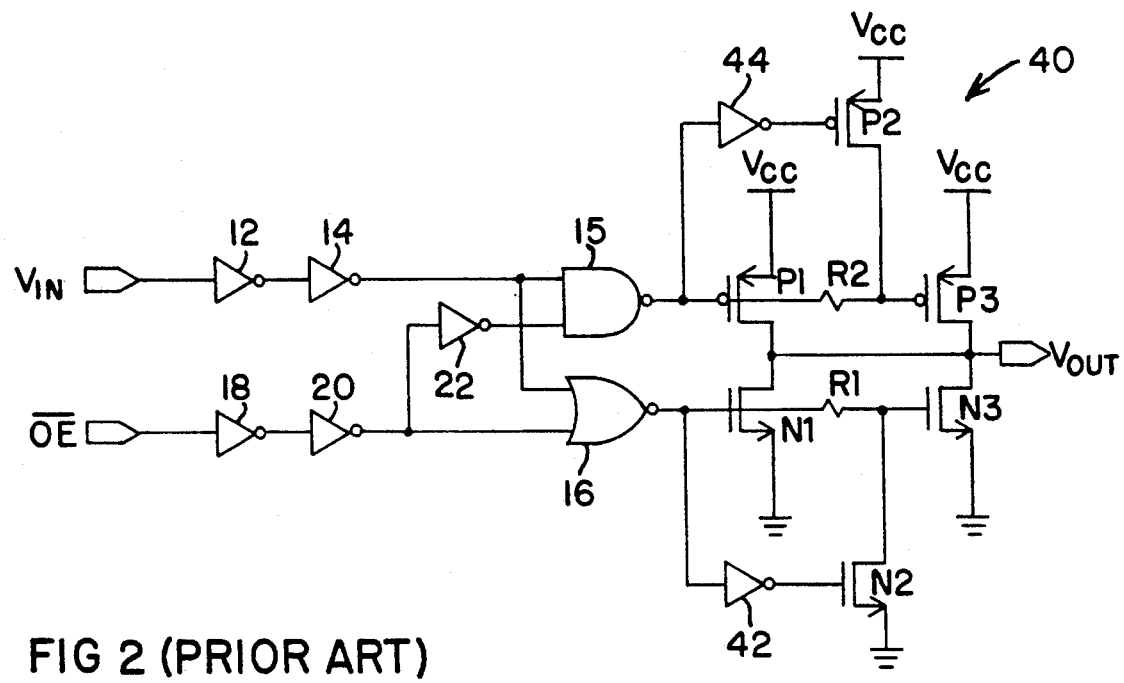
FIG. 2 is a schematic circuit diagram of the all CMOS transistor output buffer circuit for reducing switching induced noise described in U.S. Pat. No. 4,961,010.
Figure 3:
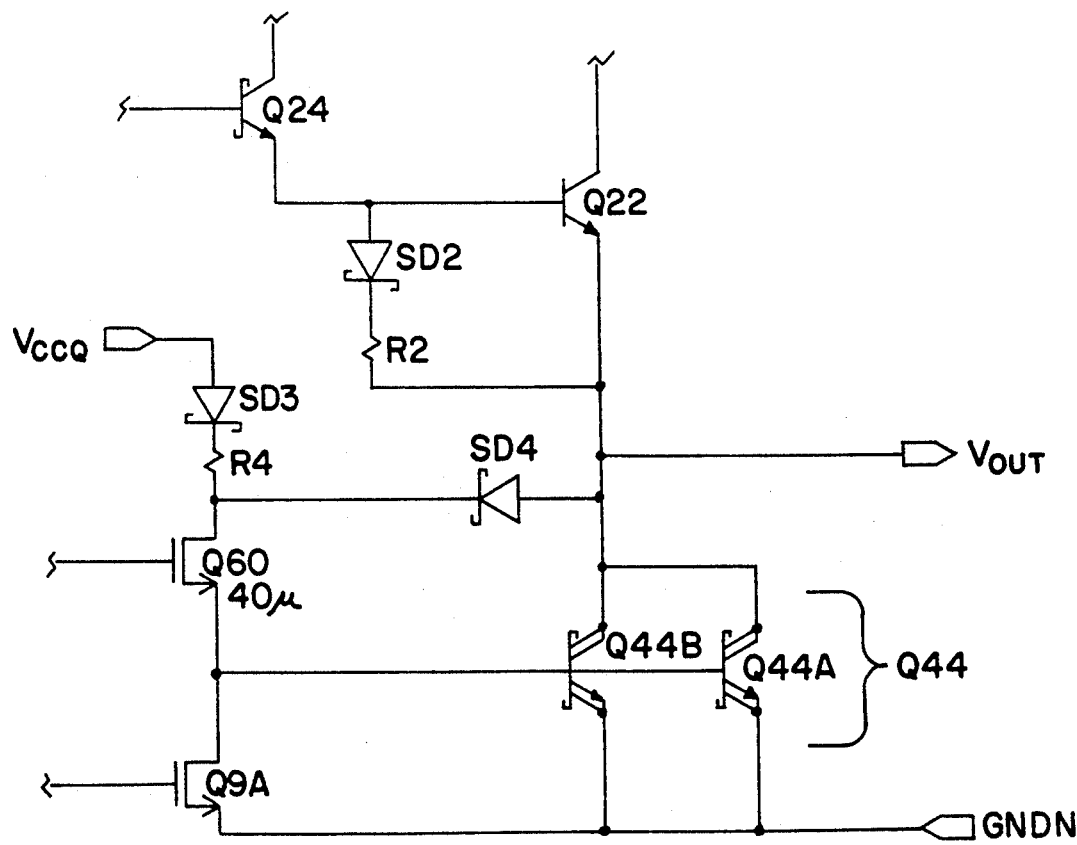
FIG. 3 is a fragmentary schematic circuit diagram of the relevant BICMOS pulldown circuit portion of the related circuit of FIG. 1.
Figure 4:
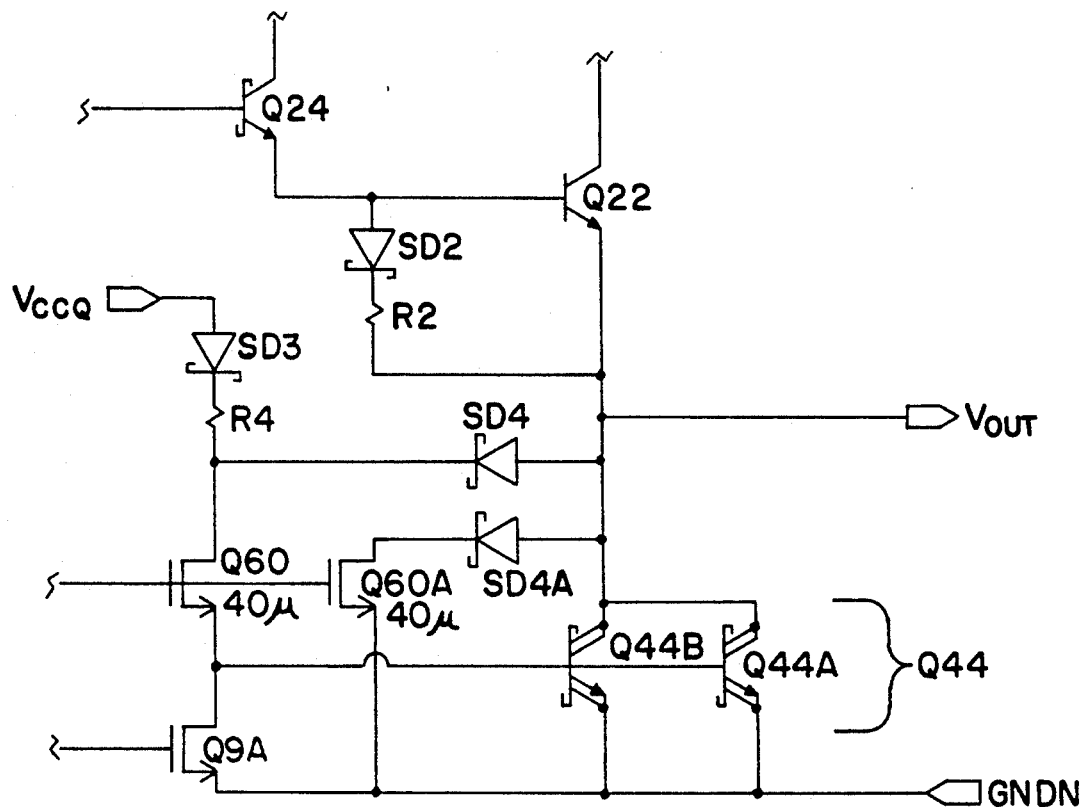
FIG. 4 is a fragmentary schematic circuit diagram of the BICMOS pulldown circuit portion with noise reduction circuit according to the invention using a CMOS secondary output pulldown transistor for reduction of maximum peak output noise $V_{OLP}$ at the bipolar output stage.

A fragmentary portion of the related art circuit of FIG. 1 and in particular the pulldown circuit portion of the BICMOS output buffer circuit relevant to the present invention is illustrated in FIG. 3. The circuit components are indicated by the same reference designations as in FIG. 1. The first embodiment of the present invention showing the improvement upon this fragmentary portion of the circuit is shown in FIG. 4. Referring to FIG. 4, a relatively small current conducting CMOS secondary output pulldown transistor Q60A with the primary current path through drain and source nodes coupled between the output $V_{OUT}$ and low potential power rail or output ground rail GNDN. Secondary output pulldown transistor Q60A is an NMOS transistor with drain node coupled to the output $V_{OUT}$ through Schottky diode SD4A. The control gate node of NMOS secondary output pulldown transistor Q60A is coupled to the control gate node of the CMOS output pulldown driver transistor Q60.

The primary current path through drain and source nodes of the NMOS secondary output pulldown transistor Q60A is coupled in parallel with the primary current path through collector and emitter nodes of the bipolar output pulldown transistor Q44. The control gate node, however is coupled in parallel with the control gate node of the NMOS pulldown driver transistor Q60 to initiate early pulldown of a small sinking current from the output $V_{OUT}$ directly to ground GNDN before turn on of the bipolar output pulldown transistor Q44.

Figure 6:
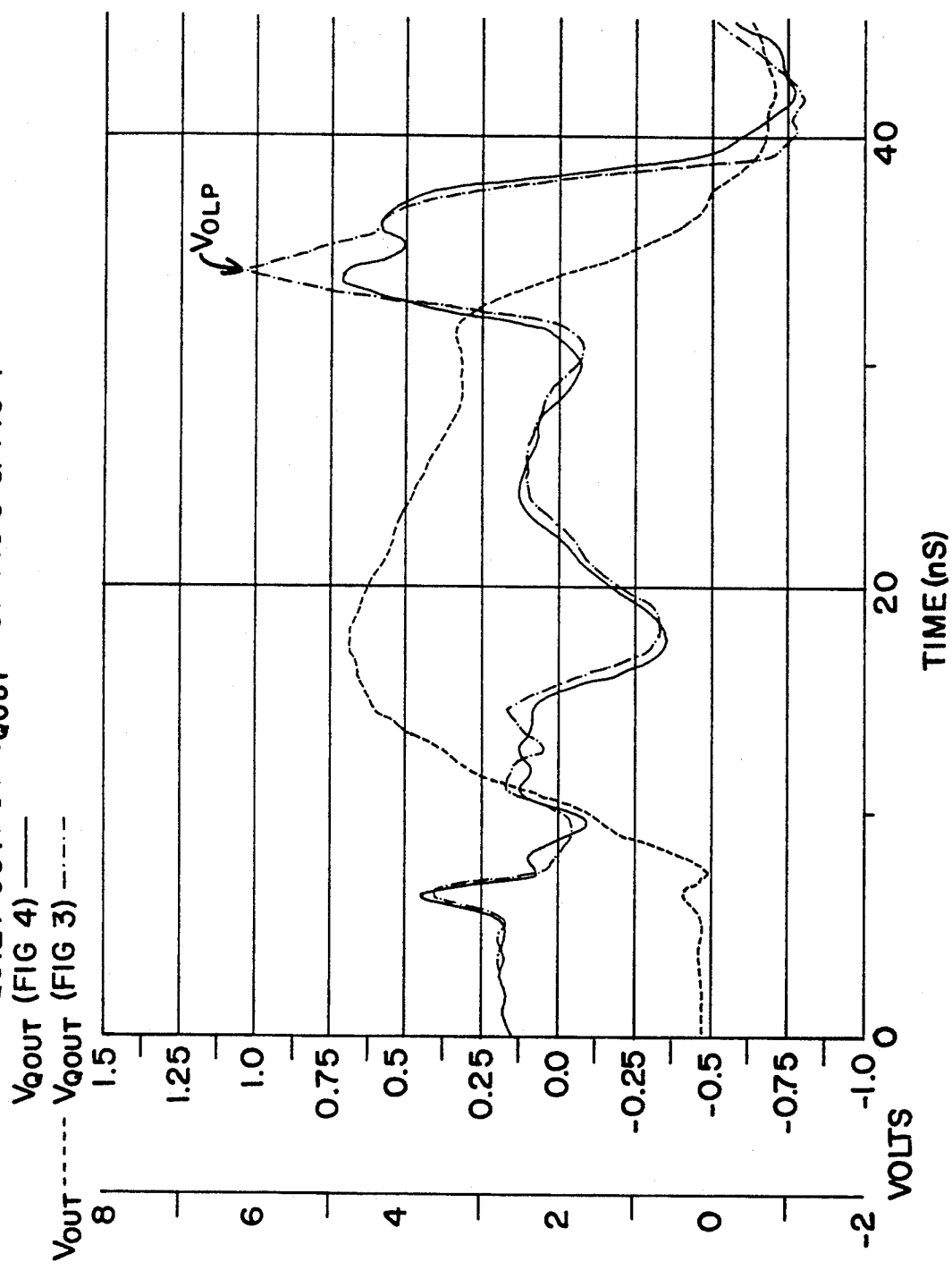
FIG. 6 is a graph of output voltage verses time during a switching transition between high and low potential levels at the output showing reduction in maximum peak output noise $V_{OLP}$ by the circuit of FIG. 4.

The CMOS secondary output pulldown transistor Q60A performs at least two important functions in "shaping" or controlling the ground current and output noise. First it provides an early diversion directly to ground of some of the output load capacitance discharge current. This reduces the accelerating feedback current through accelerating feedback diode SD4 to the base node of bipolar output pulldown transistor Q44 softening the edge rate of the turn on transition of Q44. This reduces the maximum peak $V_{OLP}$ output noise in comparison with the circuits of FIGS. 1 and 3 as shown in the graph of FIG. 6. Second, the early diversion of a small discharge current reduces the discharge current through the primary bipolar output pulldown transistor Q44. It assures that the softening of edge rates and reduction of peak output noise is accomplished without sacrificing the propagation time. The discharge of output load capacitance is accomplished over the same time period but with more favorable distribution of current and rate of change of current for noise reduction.

Another interacting circuit feature of the invention shaping the ground current and output noise is also illustrated in FIG. 4. The fast DCMK Miller Killer transistor Q9A is still conducting at the beginning of a high to low HL transition at the output $V_{OUT}$. As bipolar pulldown transistor Q44 turns on, the small MK transistor Q9A also diverts some of the initial accelerating feedback base drive current to Q44, softening the edge rate of the turn on transition of Q44 before the small MK transistor Q9A turns off.

Figure 5:
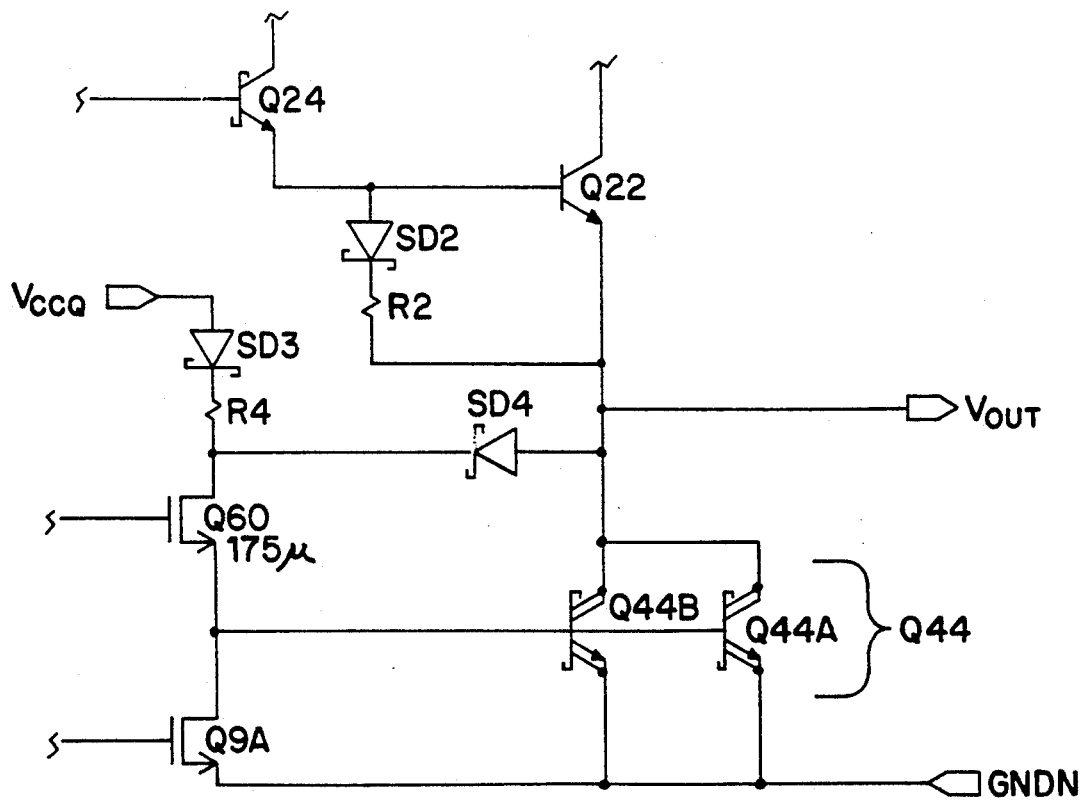
FIG. 5 is a fragmentary schematic circuit diagram of the relevant pulldown circuit portion showing the noise reduction circuit with CMOS feed forward circuit capacitance for reducing minimum peak output noise $V_{OLP}$ at the bipolar output stage.

A further noise reduction circuit embodiment of the invention is illustrated with reference to the relevant portion of the circuit of FIG. 1 in the fragmentary circuit diagrams of FIG. 5 and FIG. 5A. The difference in the circuit of FIG. 5 from the circuit of FIG. 3 is that a large feed forward circuit capacitance is added to the circuit in the form of a substantially greater gate channel width and channel capacitance in the pulldown driver transistor Q60. In the circuit of FIG. 5 the gate area and channel capacitance is substantially increased with a channel width of 175 microns in comparison with the 40 micron channel width of the pulldown predriver transistor Q60 in the circuits of FIGS. 3 and 4.

The significant effect of this structural difference occurs upon a low to high LH data signal transition at the control gate node of pulldown predriver transistor Q60 leading to a high to low HL transition at the output $V_{OUT}$. The large gate capacitance of pulldown predriver transistor Q60 slows turn on of this transistor. However a substantial transient capacitive current proportional to Cdv/dt is sufficient to turn on the bipolar output pulldown transistor Q44 at a low level of conduction. The early turn on of bipolar output pulldown transistor Q44 therefore sinks a small discharge current from the output $V_{OUT}$ before pulldown driver transistor Q60 turns on and delivers sustained base drive current to Q44. The early turn on of Q44 at a low level of conduction softens the subsequent deceleration of current and the ground undershoot or minimum peak $V_{OLV}$ in the ground rail and at the output $V_{OUT}$.

The capacitance value of the feed forward circuit capacitance is selected to provide a sufficient transient capacitive current for early turn on of bipolar output pulldown transistor Q44. It is found that this feed forward capacitance attenuates the falling edge of the sudden surge of discharge current through Q44 improving $V_{OLV}$. At the same time the large gate capacitance of pulldown driver transistor Q60 actually slows the turn on of Q60 also softening the rising edge. By this combination of edge rate control features the overall peaks of output noise are improved.

Figure 7:
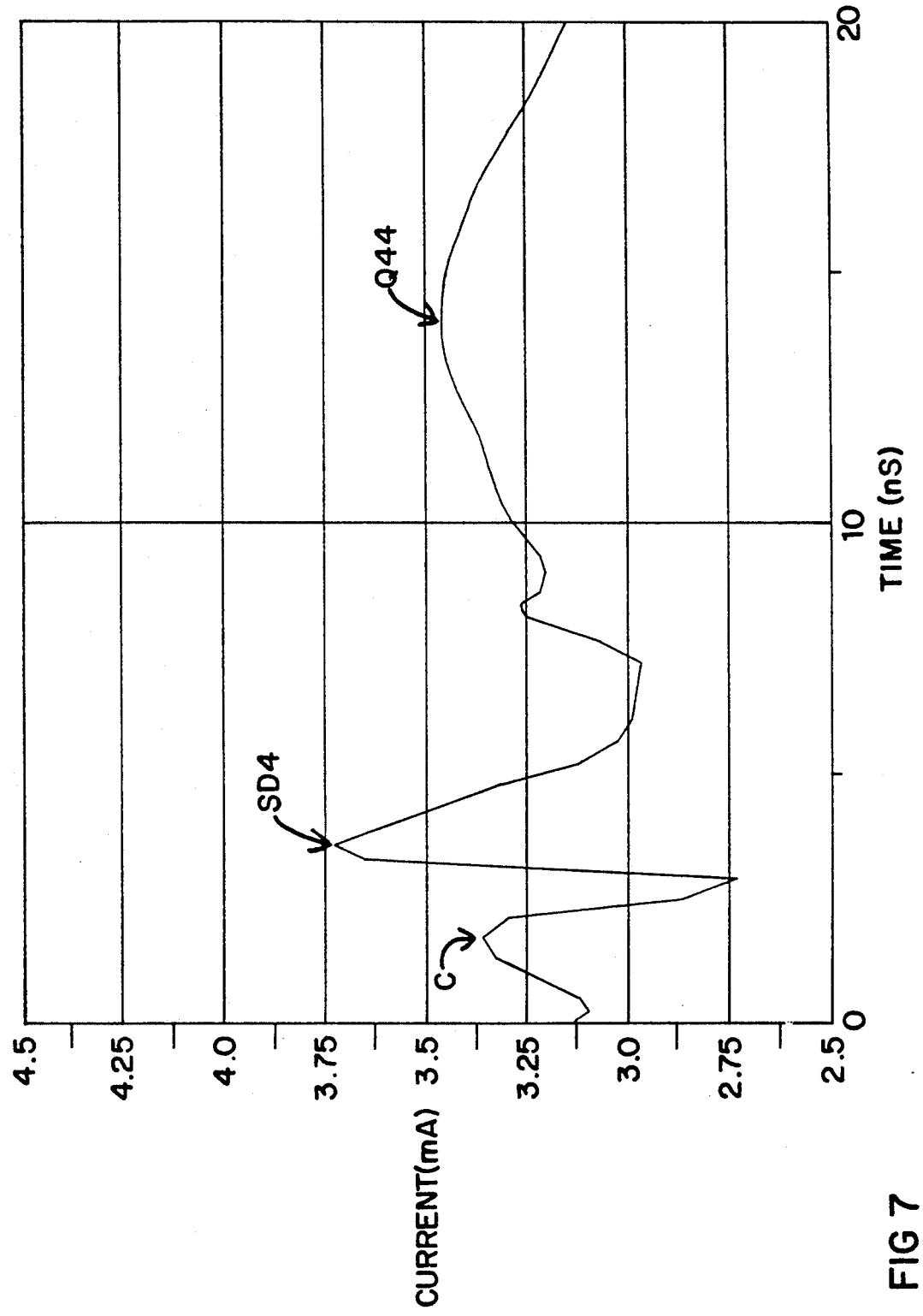
FIG. 7 is a graph of base drive current to the base of the bipolar output pulldown transistor Q44 verses time during switching events at the output.
Figure 8:
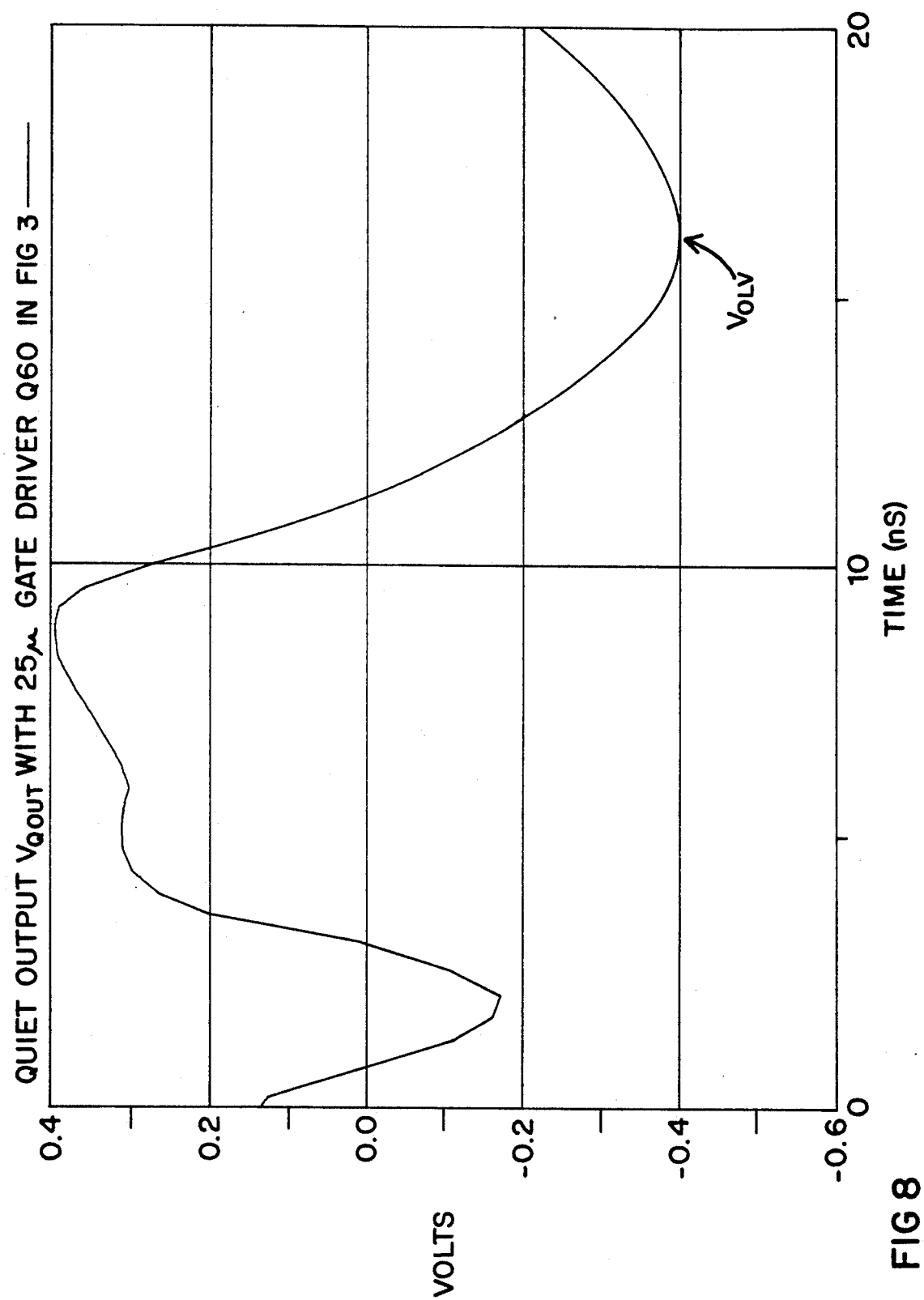
FIG. 8 is a graph of output voltage verses time for the related art circuit of FIG. 3 and FIG. 1 showing the minimum peak (or maximum valley $V_{OLV}$ of output noise.
Figure 9:
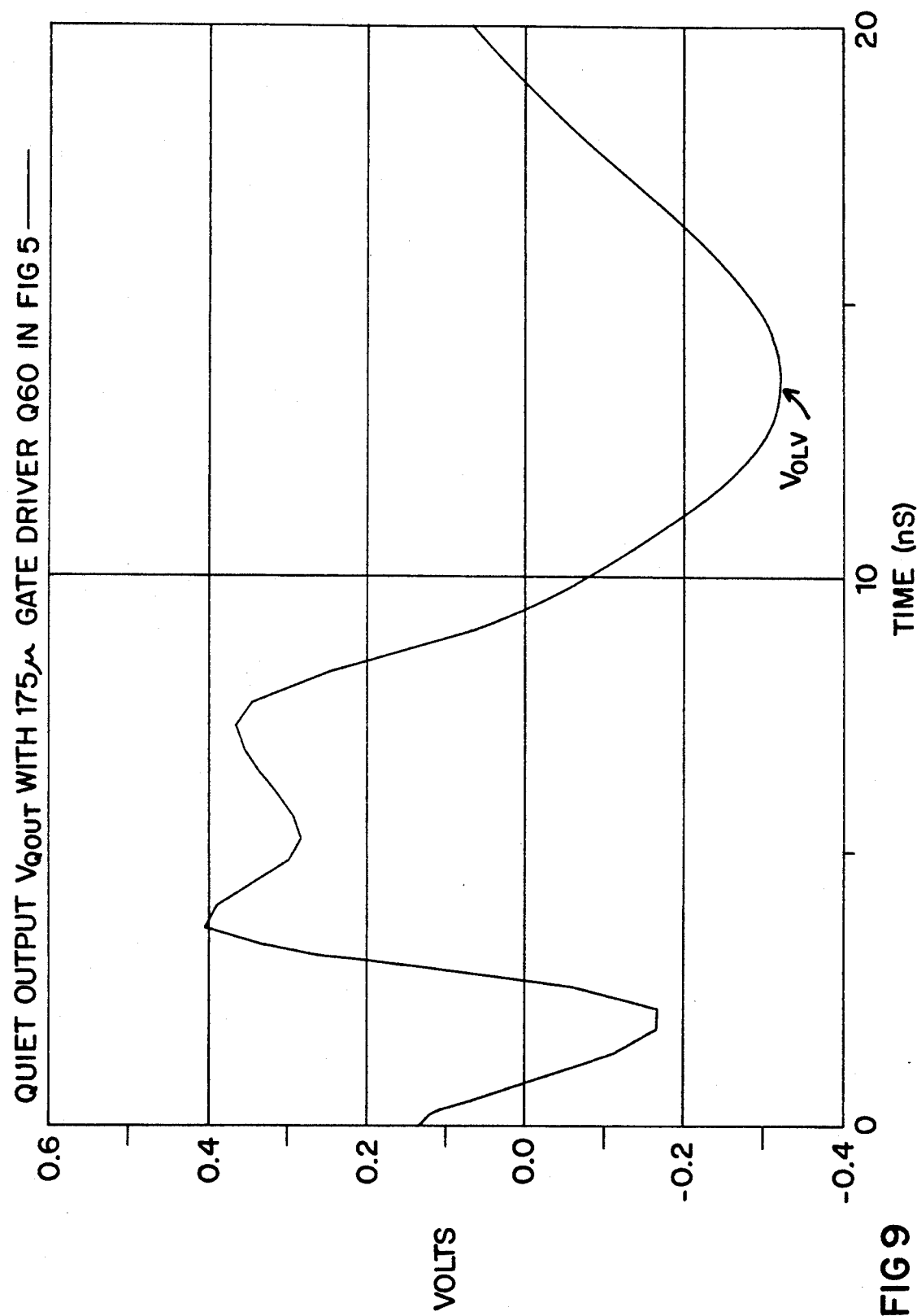
FIG. 9 is a graph of output voltage verses time during switching events at the output for the circuit of FIG. 5 showing improvement in the maximum low valley $V_{OLV}$ of the output noise.

In the graph of FIG. 7, base drive current to the base of bipolar output pulldown transistor Q44 from the pulldown predriver CMOS transistor Q60 is shown as a function of time. The first peak of base drive current is the contribution of the transient capacitive current delivered by the feed forward circuit capacitance during LH transition at the gate node of Q60. The second larger peak of base drive current is the result of the surge of accelerating feedback current through accelerating feedback diode SD4 during the HL transition at the output $V_{OUT}$. The third and muted peak is the sustained base drive current delivered by CMOS pulldown driver transistor Q60 in its conducting state. The improvement in the ground undershoot and minimum peak output voltage $V_{OLV}$ is indicated by the comparison of performance of the circuits of FIGS. 3 and 5 illustrated in the graphs of FIGS. 8 and 9. The maximum "valley" or minimum peak is attenuated by approximately 25% as shown in the graph of FIG. 9. It is also noted that the feed forward circuit capacitance may be provided by a separate circuit component capacitor C2 coupled between the control gate node of pulldown driver transistor Q60 and the base node of bipolar output pulldown transistor Q44 as shown in FIG. 5A.

Figure 5A:
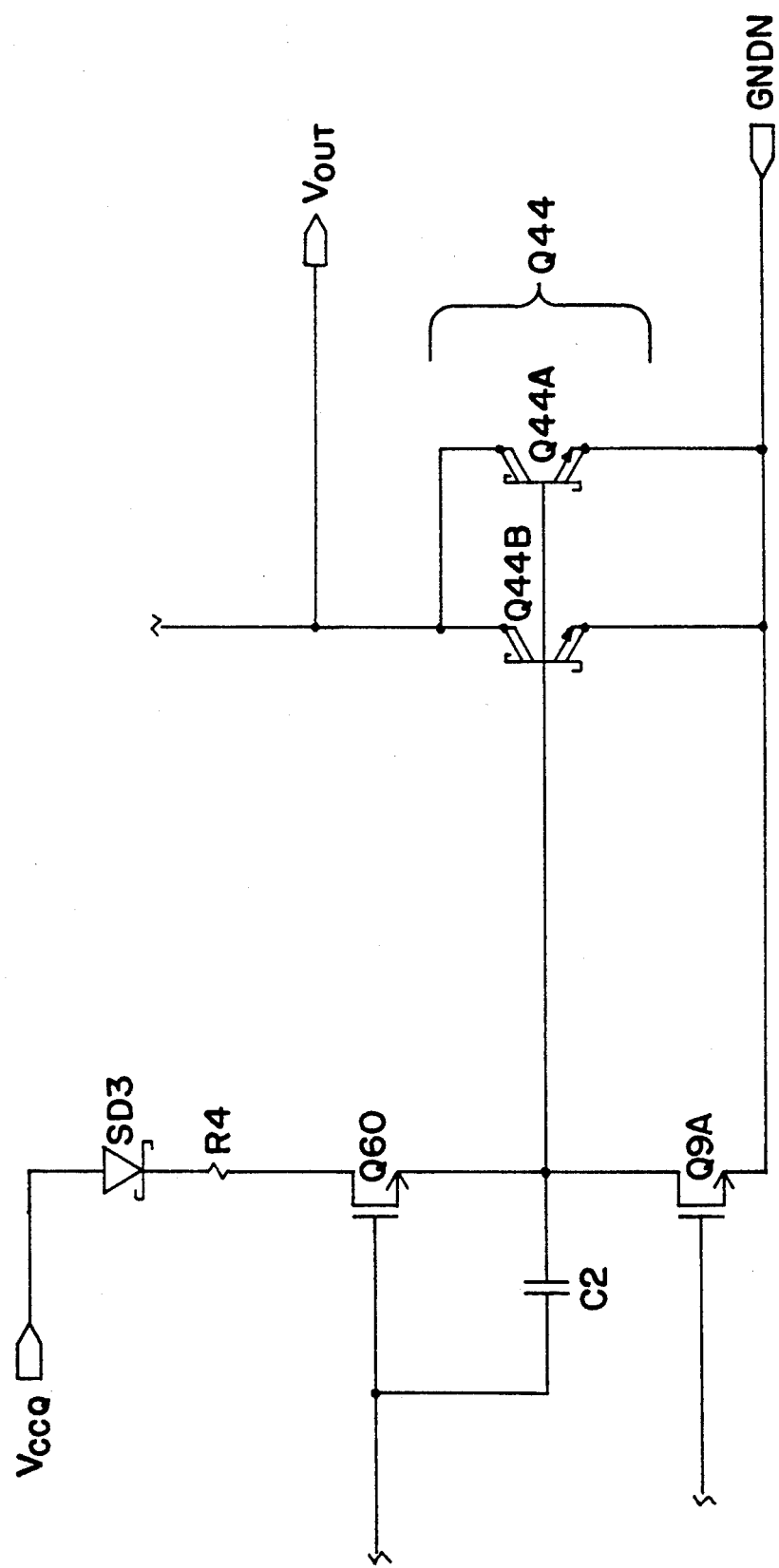
FIG. 5A is a fragmentary schematic circuit diagram showing an alternative embodiment with a separate circuit component feed forward capacitor.

Parameters and values for the circuit components in the circuits of FIGS. 4,5 and 5A are selected according to the circuit application switching speed and edge rates and noise specifications. Furthermore, the circuits of FIGS. 4 and 5 may be combined for greater control and shaping of both the rising edge and falling edge of ground current and the peaks of output noise $V_{OLP}$ and $V_{OLV}$. While the invention has been described with reference to particular circuit embodiments it is intended to cover all modifications and equivalents within the scope of the following claims.

We claim:

1. A BICMOS output buffer circuit for delivering output signals of high and low potential levels at an output in response to data signals at an input, a relatively large current conducting bipolar primary output pulldown transistor having a primary current path through collector and emitter nodes coupled for sinking current from the output to a low potential power rail, a MOS output pulldown driver transistor having a primary current path through drain and source nodes coupled to a base node of the bipolar primary output pulldown transistor and a control gate node coupled to the input through an input circuit, the improvement for reducing output noise at a quiet output coupled to a common bud during switching of the BICMOS output buffer circuit comprising:

a relatively small current conducting MOS secondary output pulldown transistor having a primary current path through drain and source nodes coupled between the output and low potential power rail in parallel with the primary current path of the bipolar primary output pulldown transistor, said primary current path of the MOS secondary output pulldown transistor being coupled to the output through a secondary output pulldown diode, said MOS secondary output pulldown transistor having a control gate node coupled to the control gate node of the MOS output pulldown driver transistor to initiate pulldown of a small sinking current from the output directly to ground before turn on of the bipolar primary output pulldown transistor, to reduce peak output noise.

2. The BICMOS output buffer circuit of claim 1 wherein the MOS secondary output pulldown transistor comprises an NMOS transistor having a drain node coupled to said secondary output pulldown diode.

3. The BICMOS output buffer circuit of claim 1 comprising an accelerating feedback diode coupled between the output and the primary current path of the MOS output pulldown driver transistor to increase base drive current to the bipolar output pulldown transistor.

4. The BICMOS output buffer circuit of claim 3 comprising a relatively fast switching and small current conducting MOS Miller Killer (MK) transistor coupled between the base node of the bipolar output pulldown transistor and low potential power rail, said MK transistor interacting with other circuit components to provide further control of peak output noise.

5. A BICMOS output buffer circuit for delivering output signals of high and low potential levels at an output ($V_{OUT}$) in response to data signals at an input ($V_{IN}$), a relatively large current conducting bipolar output pulldown transistor (Q44) having a primary current path through collector and emitter nodes coupled for sinking current from the output ($V_{OUT}$) to a low potential power rail (CNDN), a MOS output pulldown driver transistor (Q60) having a primary current path through drain and source nodes coupled to a base node of the bipolar primary output pulldown transistor (Q44) and a control gate node coupled to the input ($V_{IN}$) through an input circuit, the improvement for reducing output noise at a quiet output coupled to a common bus during switching of the BICMOS output buffer circuit comprising:

feed forward circuit capacitance coupled between the control gate node of the MOS output pulldown driver transistor (Q60) and the base node of the bipolar output pulldown transistor (Q44), said feed forward circuit capacitance having a capacitance value great enough to pass a transient capacitive current to the base node of the bipolar output pulldown transistor (Q44) upon occurrence of an input signal transition at the control gate node of the MOS output pulldown driver transistor (Q60) sufficient for early turn on of the bipolar output pulldown transistor (Q44) before the MOS output pulldown driver transistor (Q60) delivers sustained conduction current to the base node of the bipolar output pulldown transistor (Q44), to reduce peak output noise ($V_{OLV}$).

6. The BICMOS output buffer circuit of claim 5 wherein the feed forward circuit capacitance comprises a relatively large control gate channel capacitance of the MOS output pulldown driver transistor (Q60) for generating a transient capacitive current sufficient for early turn on of the bipolar output pulldown transistor (Q44) before the output pulldown driver transistor (Q60) delivers sustained conduction current to the base node of the bipolar output pulldown transistor (Q44).

7. The BICMOS output buffer circuit of claim 6 wherein the MOS output pulldown driver transistor comprises an NMOS transistor (Q60), and further comprising a relatively high resistance resistor (R4) coupling a drain node of the NMOS transistor (Q60) to a high potential power rail ($V_{CCQ}$) for limiting base drive current to the bipolar output pulldown transistor (Q44).

8. The BICMOS output buffer circuit of claim 6 wherein the feed forward circuit capacitance comprises a circuit component capacitor separate from the MOS output pulldown driver transistor (Q60).

9. The BICMOS output buffer circuit of claim 6 wherein the primary current path of the MOS output pulldown driver transistor (Q60) is coupled to a high potential power rail ($V_{CCQ}$) through a relatively high resistance resistor (R4) for limiting base drive current to the bipolar output pulldown transistor (Q60).

10. A BICMOS output buffer circuit for delivering output signals of high and low potential levels at an output ($V_{OUT}$) in response to data signals at an input ($V_{IN}$), a relatively large current conducting bipolar primary output pulldown transistor (Q44) having a primary current path through collector and emitter nodes coupled for sinking current from the output ($V_{OUT}$) to a low potential power rail (GNDN), a MOS output pulldown driver transistor (Q60) having a primary current path through drain and source nodes coupled to a base node of the bipolar primary output pulldown transistor (Q44) and a control gate node coupled to the input ($V_{IN}$) through an input circuit, the improvement for reducing output noise at a quiet output coupled to a common bus during switching of the BICMOS output buffer circuit comprising:

a relatively small current conducting MOS secondary output pulldown transistor (Q60A) having a primary current path through drain and source nodes coupled between the output ($V_{OUT}$) and low potential power rial (GNDN) in parallel with the primary current path of the bipolar primary output pulldown transistor (Q44), said MOS secondary output pulldown transistor (Q60A) having a control gate node coupled to the control gate node of the MOS output pulldown driver transistor (Q60) to initiate pulldown of a small sinking current from the output ($V_{OUT}$) directly to ground (GNDN) before turn on of the bipolar primary output pulldown transistor (Q44), to reduce peak output noise ($V_{OLP}$) at a quiet output coupled to a common bus with the output ($V_{OUT}$) of the BICMOS output buffer circuit; and feed forward circuit capacitance coupled between the control gate node of the MOS output pulldown driver transistor (Q60) and the base node of the bipolar output pulldown transistor (Q44), said feed forward circuit capacitance having a capacitance value great enough to pass a transient capacitive current to the base node of the bipolar output pulldown transistor (Q44) upon occurrence of an input signal transition at the control gate node of the MOS output pulldown driver transistor (Q60) sufficient turn on of the bipolar output pulldown transistor (Q44) before the MOS output pulldown predriver transistor (Q60) delivers sustained conduction current to the base node of the bipolar output pulldown transistor (Q44) to reduce peak output noise ($V_{OLV}$) at said quiet output.

11. The BICMOS output buffer circuit of claim 10 wherein the primary current path of the MOS secondary output pulldown transistor (Q60A) is coupled to the output through a secondary output pulldown diode (SD4A).

12. The BICMOS output buffer circuit of claim 11 wherein the MOS secondary output pulldown transistor comprises an NMOS transistor (Q60A) having a drain node coupled to said secondary output pulldown diode (SD4A).

13. The BICMOS output buffer circuit of claim 11 comprising an accelerating feedback diode (SD4) coupled between the output ($V_{OUT}$) and the primary current path of the MOS output pulldown driver transistor (Q60) to increase base drive current to the bipolar output pulldown transistor (Q44).

14. The BICMOS output buffer circuit of claim 11 comprising a relatively fast switching and small current conducting MOS Miller Killer (MK) transistor (Q9A) coupled between the base node of the bipolar output pulldown transistor (Q44) and low potential power rail (GNDN), said MK transistor (Q9A) interacting with other circuit components (Q60, Q44, SD4) to provide further control of peak output noise ($V_{OLP}$, $V_{OLV}$).

15. The BICMOS output buffer circuit of claim 10 wherein the feed forward circuit capacitance comprises a relatively large control gate channel capacitance of the MOS output pulldown predriver transistor (Q60) for generating a transient capacitive current sufficient for early turn on of the bipolar output pulldown transistor (Q44) before the output pulldown predriver transistor (Q60) delivers sustained conduction current to the base node of the bipolar output pulldown transistor (Q44).

16. The BICMOS output buffer circuit of claim 15 wherein the MOS output pulldown driver transistor comprises an NMOS transistor (Q60), and further comprising a relatively high resistance resistor (R4) coupling a drain node of the NMOS transistor (Q60) to a high potential power rail ($V_{CCQ}$) for limiting base drive current to the bipolar output pulldown transistor (Q44).

17. The BICMOS output buffer circuit of claim 10 wherein the feed forward circuit capacitance comprises a circuit component capacitor separate from the MOS output pulldown driver transistor (Q60).

18. The BICMOS output buffer circuit of claim 17 wherein the primary current path of the MOS output pulldown driver transistor (Q60) is coupled to a high potential power rail ($V_{CCQ}$) through a relatively high resistance resistor (R4) for limiting base drive current to the bipc'ar output pulldown transistor (Q44).

* * * * *